(12) United States Patent
Cok et al.

(10) Patent No.: US 6,807,211 B1
(45) Date of Patent: Oct. 19, 2004

(54) WHITE-LIGHT LASER

(75) Inventors: Ronald S. Cok, Rochester, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/445,980

(22) Filed: May 27, 2003

(51) Int. Cl.[7] .............................. H01S 3/14; H01S 3/08
(52) U.S. Cl. ........................................ 372/39; 372/96
(58) Field of Search ................................ 372/39–50, 96

(56) References Cited

U.S. PATENT DOCUMENTS

| | | | |
|---|---|---|---|
| 4,021,845 A | | 5/1977 | Wang |
| 5,418,803 A | | 5/1995 | Zhiglinsky et al. |
| 5,428,635 A | | 6/1995 | Zhiglinsky et al. |
| 5,614,961 A | | 3/1997 | Gibeau et al. |
| 5,764,663 A | | 6/1998 | Ouchi et al. |
| 5,821,571 A | * 10/1998 | Lebby et al. | ................... 257/98 |
| 6,160,828 A | * 12/2000 | Kozlov et al. | ................. 372/39 |
| 6,172,459 B1 | * 1/2001 | Hung et al. | ................... 313/506 |
| 2003/0146371 A1 | * 8/2003 | Gudesen et al. | .......... 250/214.1 |
| 2004/0057120 A1 | * 3/2004 | Olszak et al. | ............... 359/619 |
| 2004/0101008 A1 | * 5/2004 | Kurtz et al. | .................... 372/39 |

OTHER PUBLICATIONS

Carl W. Wilmsen et al., "Vertical–Cavity Surface–Emitting Lasers," Cambridge University Press, 1999.

Scott W. Corzine et al., "Design of Fabry–Perot Surface–Emitting Lasers With a Periodic Gain Structure," IEEE Journal of Quantum Electronics, vol. 25, No. 6, Jun. 1989, pp. 1513–1524.

E. F. Schubert et al., "Highly Efficient Light–Emitting Diodes With Microcavities," SCIENCE, vol. 265, Aug. 12, 1994, pp. 943–945.

* cited by examiner

*Primary Examiner*—Don Wong
*Assistant Examiner*—Phillip Nguyen
(74) *Attorney, Agent, or Firm*—Stephen H. Shaw (57) ABSTRACT

A white-light laser integrated structure that includes a substrate; and one or more individually addressable laser light pixels formed on the substrate for emitting a white beam of laser light perpendicular to the substrate. Each of the one or more individually addressable laser light pixels include one or more organic light emitting diodes (OLEDs) and a plurality of organic vertical cavity lasers that are arranged to be optically pumped by the one or more OLEDs. The plurality of organic vertical cavity lasers emits differently colored light and the one or more individually addressable laser light pixels emit substantially white light when the differently colored light is combined.

38 Claims, 7 Drawing Sheets

(PRIOR ART)

WHITE-LIGHT LASER

FIELD OF THE INVENTION

The present invention relates to lasers and, more particularly, to white-light lasers.

BACKGROUND OF THE INVENTION

Lasers are a well-known technology with many applications in a wide variety of areas such as projection display and telecommunications. Typical lasers generate a monochromatic, single-wavelength beam of coherent, collimated light. It is also useful to produce polarized laser light and such beams of light are widely used in optical applications. There are also applications for beams of white laser light including several individual wavelengths of light that, taken together form a white color.

Means to create white-light lasers are known in the art. For example, U.S. Pat. No. 5,418,803 titled, "White Light Laser Technology" issued May 23, 1995 to Zhiglinsky et al. and U.S. Pat. No. 5,428,635 titled, "Multi-Wavelength Tunable Laser" issued Jun. 27, 1995 to Zhiglinsky et al. describe a laser capable of generating polychromatic or white-light radiation by employing a diffraction grating and reflecting element as the ends of a simple laser resonator cavity. The dispersive element either solely or in combination with an intra-cavity lens is arranged such that each wavelength component of the white-light radiation is amplified by a different portion of the active medium. Forced oscillation or positive feedback for each wavelength component is achieved by operating the diffraction grating in an auto-collimation configuration. This technique requires the use of special diffraction grating or intra-cavity lens elements, is complex to manufacture, and includes multiple layers of active medium within the resonant cavity. Moreover, it does not provide a thin, low-volume laser device and the efficiency of the device suffers from supporting multiple wavelength emission from a single cavity. Nor does this technique support the production of polarized white light.

White laser light can also be formed by combining individual laser beams as described in U.S. Pat. No. 5,614,961 titled, "Methods And Apparatus For Image Projection, issued Mar. 25, 1997 to Gibeau et al. by utilizing three linear laser arrays. Each linear array generates multiple (N>1) parallel output beamlets at one of the three primary colors (red, green, blue). The corresponding beamlets are combined spatially to form a single white-light linear array source. Through a projection/scanner optical system, the beamlets of the white-light source are simultaneously directed to, and swept horizontally across a distant viewing screen. Such a design requires complex beam combining optics, separate laser light generators, and does not create polarized light.

In yet another alternative, a white-light beam is created by sequentially outputting colored light, as in a filter wheel, by rotating a laser light source. For example, U.S. Pat. No. 5,764,663 titled, "Laser Apparatus" issued Jun. 9, 1998 to Ouchi et al. describes a laser apparatus for generating laser beams of predetermined wavelengths comprising a solid-state laser medium for generating a light beam having predetermined at least three fundamental wavelengths; at least three wavelength converters which respectively convert the light beam into harmonics corresponding to three primary colors of blue, green, and red, the wavelength-converters being circumferentially arranged; wavelength-converter holder for holding the wavelength converters; light blocking portions disposed between the wave length converters; rotating unit for rotating the wavelength-converter holder, thereby repeatedly positioning each of the wavelength converters and each of the light blocking portions on an optical axis of the solid-state laser medium; and a laser resonant optical system which resonates the light beams generated by the solid-state laser medium and outputs the harmonics converted by the wavelength converters. This method requires a mechanical rotation that is cumbersome and prone to failure and it is not capable of generating polarized light.

U.S. Pat. No. 4,021,845 titled, "Laser For Generating White Light" issued May 3, 1977 to Wang describes a laser structure for generating white laser light when energized by a source of dc voltage. The laser tube structure comprises a gas-filled envelope having a longitudinal axis and an anode electrode forming a portion of the envelope. A hollow cathode is positioned within the envelope and coaxially disposed with respect to the anode electrode portion of the envelope. Members are coaxially aligned with the ends of the envelope such that a structure is provided for confining a gaseous medium therein; a dc voltage applied between the cathode and anode electrode creating a discharge therebetween, the discharge stimulating continuous wave laser emission along the longitudinal axis of the cathode, the laser emission comprising simultaneous multi-line emissions in the form of white light. This technique requires the use of a gas-filled tube and is also complex to manufacture, does not provide a thin, low-volume laser device, and does not produce polarized light.

There is a need, therefore for an alternative white-light laser that avoids these limitations.

SUMMARY OF THE INVENTION

The need is met according to the present invention by providing a white-light laser integrated structure that includes a substrate and one or more individually addressable laser light pixels formed on the substrate for emitting a white beam of laser light perpendicular to the substrate. Each of the one or more individually addressable laser light pixels include one or more organic light emitting diodes (OLEDs) and a plurality of organic vertical cavity lasers that are arranged to be optically pumped by the one or more OLEDs. The plurality of organic vertical cavity lasers emit differently colored light and the one or more individually addressable laser light pixels emits substantially white light when the differently colored light is combined.

Another aspect of the present invention provides a polarized white-light laser, that includes a substrate and one or more individually addressable laser light pixels formed on the substrate for emitting a white beam of laser light perpendicular to the substrate. Each of the one or more individually addressable laser light pixels includes one or more organic light emitting diodes (OLEDs) and a plurality of organic vertical cavity lasers, having an asymmetric shape and producing polarized light. The one or more individually addressable laser light pixels are arranged to be optically pumped by the one or more OLEDs. The plurality of organic vertical cavity lasers emit differently colored light and the one or more individually addressable laser light pixels emits substantially white light when the differently colored light is combined.

A third aspect of the present invention provides a system for producing an array of image elements forming a collimated beam of patterned white-light, that include: a controller and connections; a plurality of individually addressable laser light pixels formed on a common substrate responsive to the controller for producing the array of image elements; and each of the plurality of individually addressable laser light pixels include one or more organic light emitting diodes (OLEDs) and a plurality of organic vertical cavity lasers that are arranged to be optically pumped by the one or more OLEDs, wherein the plurality of organic vertical cavity lasers emit differently colored light perpendicular to the substrate and the plurality of individually addressable laser light pixels emits substantially white light when the differently colored light is combined.

The fourth aspect of the present invention provides a method for creating a white-light laser including the steps of: providing a substrate; and forming one or more individually addressable laser light pixels on the substrate, wherein each of the one or more individually addressable laser light pixels include one or more organic light emitting diodes (OLEDs) and a plurality of spatially distributed organic vertical cavity lasers for emitting a white beam of laser light perpendicular to the substrate from a plurality of different colored light emitted from the plurality of spatially distributed organic vertical cavity lasers.

ADVANTAGES

The present invention has the advantage that a simple integrated structure can be employed to create a white laser with polarized light.

DETAILED DESCRIPTION OF THE INVENTION

Figure 1A:
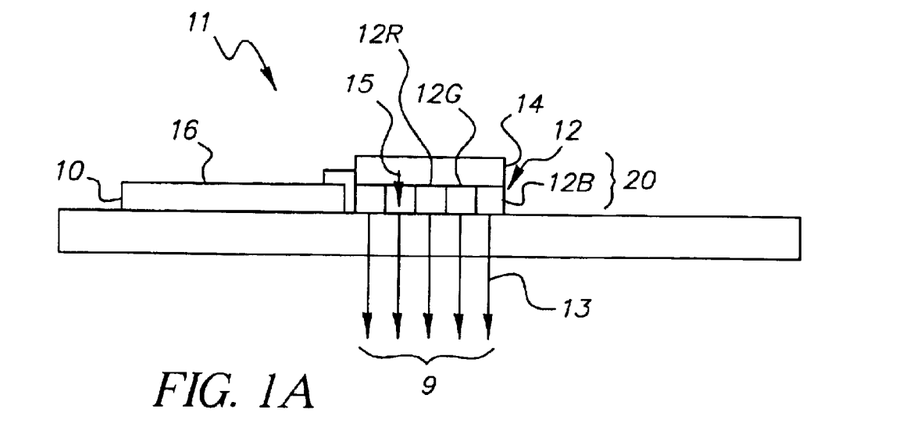
FIGS. 1A–1C are block diagrams of the structure for the white laser light according to the present invention.
Figure 1B:
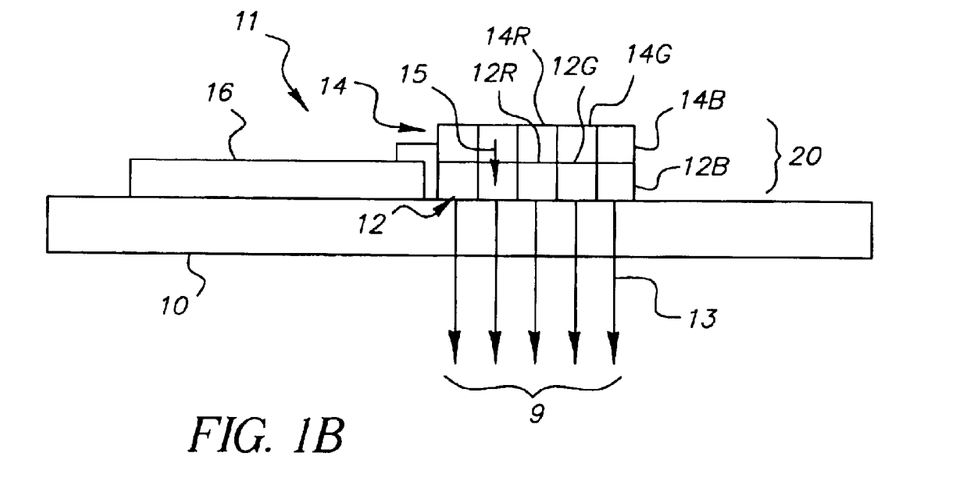
Figure 1C:
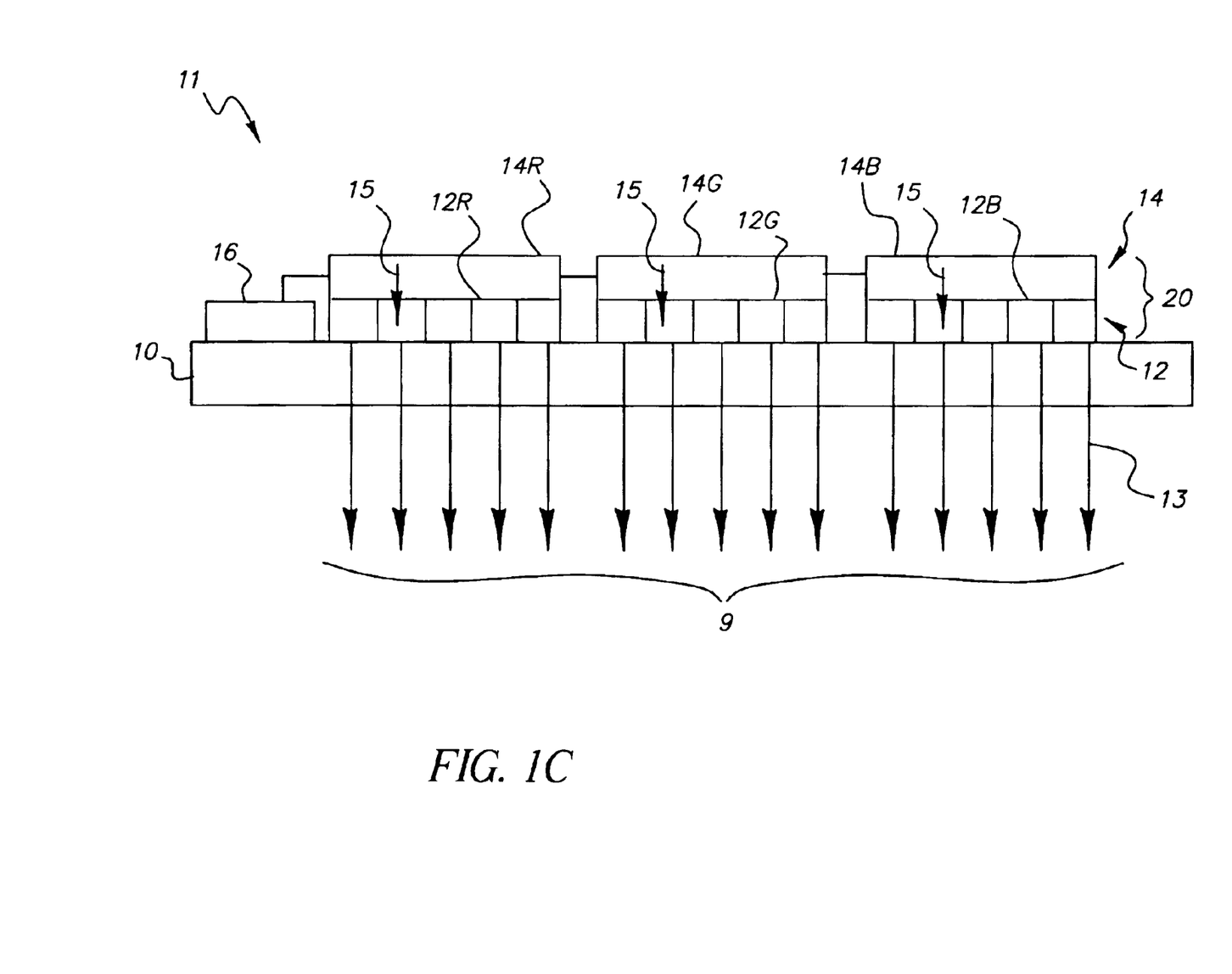

Referring to FIGS. 1A–1C, a white-light laser according to the present invention includes a substrate 10 on which is formed an array of individually addressable laser pixels 11 that each include a plurality of organic vertical cavity lasers 12 optically pumped by an electrically controlled organic light emitting diode, (OLED) 14, formed on the same substrate 10 and electrically controlled through circuits 16. The OLEDs 14 emit incoherent light 15 to optically pump the organic vertical cavity lasers 12 that, in turn, emit laser light beam 13 perpendicular to the substrate 10. The plurality of organic vertical cavity lasers 12 emit two or more different colors of light that, when combined in a beam, form a white laser light.

In FIG. 1A the individually addressable laser pixel 11 emits a plurality of differently colored laser light beams 13 to form a white-light laser beam 9 and includes a single OLED 14 using only one type of emissive material chosen to optically pump a plurality of differently colored organic vertical cavity lasers 12R, 12G, and 12B referring to red, green, and blue laser emitters, respectively. In FIG. 1B the individually addressable laser pixel 11 emits a plurality of differently colored laser light beams 13 to form a white-light laser beam 9 and includes an OLED 14 having a plurality of materials 14R, 14G, and 14B which emit red, green, and blue incoherent light, respectively, and optically pump a corresponding plurality of red, green, and blue organic vertical cavity lasers 12R, 12G, and 12B, respectively. In FIG. 1C the individually addressable laser pixel 11 emits a plurality of differently colored laser light beams 13 to form a white-light laser beam 9 and includes an OLED 14 having a plurality of materials 14R, 14G, and 14B which emit red, green, and blue incoherent light, respectively, each of which optically pumps a corresponding spatially associated group of red, green, and blue organic vertical cavity lasers 12R, 12G, and 12B, respectively. The only requirement for the OLED 14 is that it produce light that has some portion of it's spectral output absorbed by the host material in active layer 114 (shown in FIG. 3, for example). Variations on these schemes can use other organic vertical cavity lasers with different numbers of colors, for example only two different colors (for example, blue and yellow to form a substantially white light) or four different colors (for example, red, green, blue, and yellow).

Figure 2:
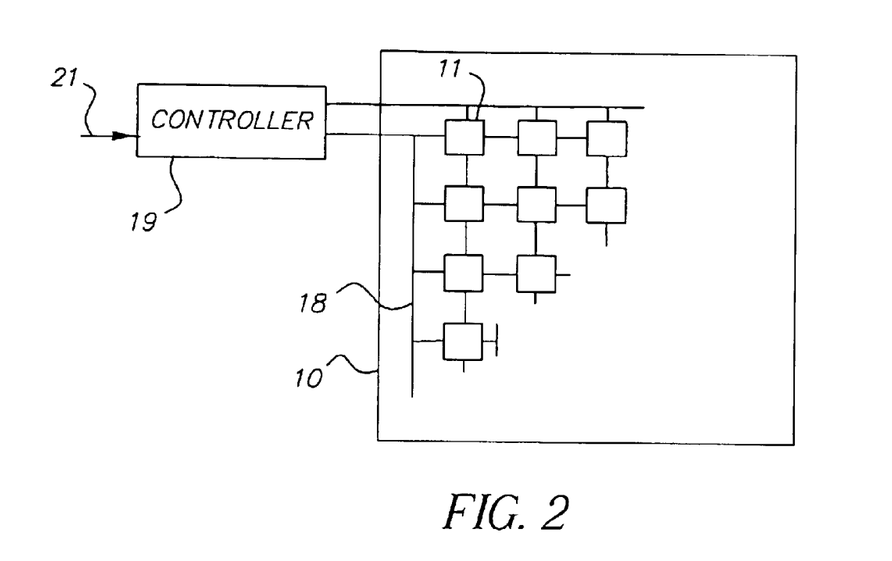
FIG. 2 is a schematic of the controller interacting with an individually addressable laser pixel according to the present invention.

Referring to FIG. 2, the individually addressable laser pixels 11 are conventionally controlled through connections 18 using a controller 19, having a bus input 21, either through a passive- or active-matrix control scheme as is well-known in the art. Such a system can be used to produce an array of image elements forming a collimated beam of patterned white-light. The individually addressable laser pixels 11 can control all of the OLED material associated with it through the use of contiguous electrodes, for example a single contiguous cathode and a single contiguous anode. Since the OLED materials within an individually controlled laser pixel 11 are all energized together, regardless of the color of incoherent light emission 15, separate electrodes are not necessary. Such a construction simplifies the layout and minimizes the layers within the white laser of the present invention. It is also possible to associate the individually controlled laser pixels 11 of the present invention with colored laser pixels (not shown). The colored laser pixels have emitters of only a single color. In this fashion, white emitters may be interspersed with colored laser emitters.

Figure 3:
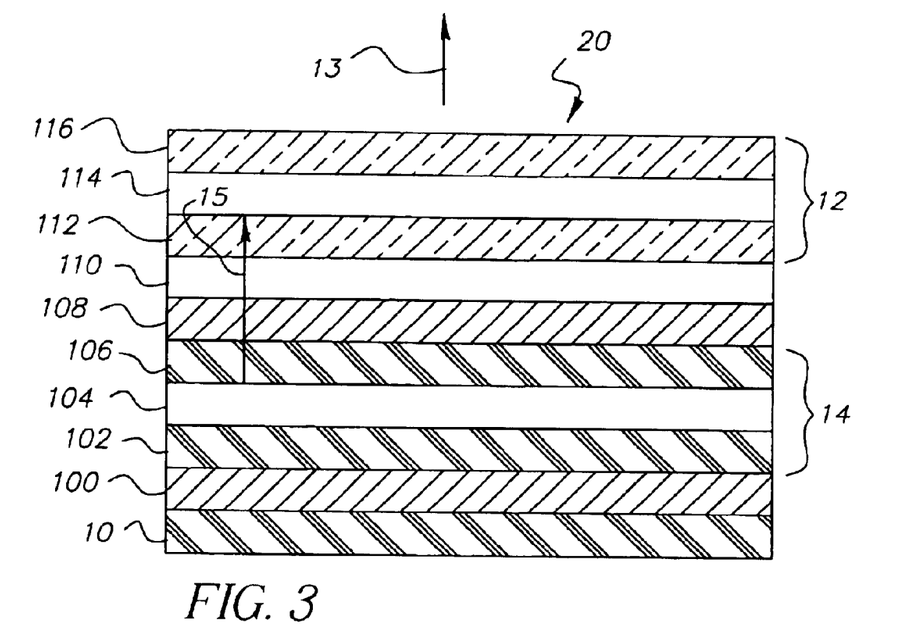
FIG. 3 is a schematic of the OLED and the organic vertical cavity laser working in combination according to the present invention.

Referring to FIG. 3, a schematic cross-section of an electrically-pumped organic solid-state laser light emitter 20 useful with the present invention includes an OLED 14, an organic vertical cavity laser 12, and a transparent planarization layer 110 located between the OLED 14 and the organic vertical cavity laser 12. The organic vertical cavity laser 12 is a vertical cavity laser that includes a pair of mirrors 112 and 116 such as distributed Bragg reflector (DBR) mirrors, and an active layer 114 that is formed from organic materials which employ a host-dopant material system as described below. Transparent planarization layer 110 is an optically transparent insulating planarization layer compatible with the OLED 14, for example silicon dioxide; however, it can be any optically-flat layer compatible with OLED 14 and upon which a DBR mirror can be grown. DBR mirror 112 is deposited on the transparent planarization layer 110. It is preferred to be grown by conventional sputtering or electron-beam (e-beam) deposition since it is important to get an accurate thickness. The bottom DBR mirror 112 is composed of alternating high and low refractive index dielectric layers, such that, at the wavelength for the laser light beam 13 its reflectivity is greater than 99.9% and it transmits greater than 90% of the incoherent light 15. DBR mirror 112 is composed of $\lambda/4$-thick alternating high and low refractive index dielectric layers in order to get a high-reflectance at the lasing wavelength, $\lambda_1$; additional alternating high and low refractive index dielectric layers are also deposited such that there results a broad transmission maximum for the incoherent light 15 emitted by the OLED 14. Over the DBR mirror 112 is deposited the organic active layer 114, which can be formed by conventional high-vacuum ($10^{-7}$ Torr) thermal vapor deposition or by spin casting from solution. In order to obtain low thresholds, it is preferred that the thickness of the active layer 114 be integer multiples of $\lambda/2$, where $\lambda$ is the lasing wavelength. The lowest thresholds are obtained for the integer multiple being either 1 or 2.

The active layer 114 comprises host and dopant organic molecules. It is preferred that the organic molecules be of small-molecular weight since currently they can be deposited more uniformly. The host materials used in the present invention are selected from any materials that have sufficient absorption of the incoherent light 15 and are able to transfer a large percentage of their excitation energy to a dopant material via Forster energy transfer. Those skilled in the art are familiar with the concept of Forster energy transfer, which involves a radiationless transfer of energy between the host and dopant molecules.

An example of a useful host-dopant combination for red-emitting lasers is aluminum tris(8-hydroxyquinoline) (Alq) as the host and 4-(dicyanomethylene)-2-t-butyl-6-(1,1,7,7-tetramethyljulolidyl-9-enyl)-4H-pyran (DCJTB) as the red-emitting dopant. A DBR mirror 116 is deposited over the active layer 114. It is also deposited by conventional e-beam deposition; however, this time it is preferred that during the deposition process the temperature of the organic materials stay below 75 C. The top DBR mirror 116 is composed of alternating high and low refractive index dielectric layers, such that, at the wavelength for the laser light beam 13 its reflectivity is typically greater than 98% and it reflects greater than 90% of the incoherent light 15. Reflectivities for the top DBR mirror are in the range of 90% or greater for the laser light beam 13. It is known in the art that the construction of highly efficient LEDs (so-called Resonant Cavity Light Emitting Diodes, or RCLEDs) is realized by reflectivity's at the lower end of this range, near 90%. See for example, "Highly Efficient Light-Emitting Diodes With Microcavities," Science, Vol. 265, Aug. 12, 1994, pages 943–945 by E. F. Schubert et al. In such devices, the opportunity exists to alter the spectral and angular width of the laser light beam 13 as well as control its degree of coherence by adjustment of the output wavelength reflectivity. Consequently, besides depositing the $\lambda/4$-thick alternating high and low refractive index dielectric layers (where $\lambda$ is chosen near the desired lasing wavelength), additional alternating high and low refractive index dielectric layers are deposited such that there results a broad reflection maximum for the incoherent light 15. In particular, it is only necessary to reflect that portion of the incoherent light 15 that is absorbed by the active layer 114 host material.

The OLEDs 14 of the organic solid-state laser emitters 20 are one or more electrically-driven organic light-emitting diode devices that produce incoherent light within a predetermined portion of the spectrum. For an example of an OLED device, see commonly assigned U.S. Pat. No. 6,172,459 titled, "Electron-Injection Layer Providing A Modified Interface Between An Organic Light-Emitting Structure And A Cathode Buffer Layer" issued Jan. 9, 2001 to Hung et al., and the references cited therein, the disclosures of which are incorporated by reference.

The OLED 14 is formed adjacent to, and preferably on, a substrate 10 on which is formed an electrode layer 100, for example a hole-injecting anode, as shown in FIG. 3. The substrate 10 can be any material suitable for the construction of OLED devices as are described in the art, for example glass, quartz, or plastic, and the electrode layer 100 can be a thin layer of indium tin oxide (ITO) or thin layers of conductive metals formed over the substrate 10. The electrode layer 100 can be deposited by evaporation, sputtering, and chemical vapor deposition.

Figure 4:
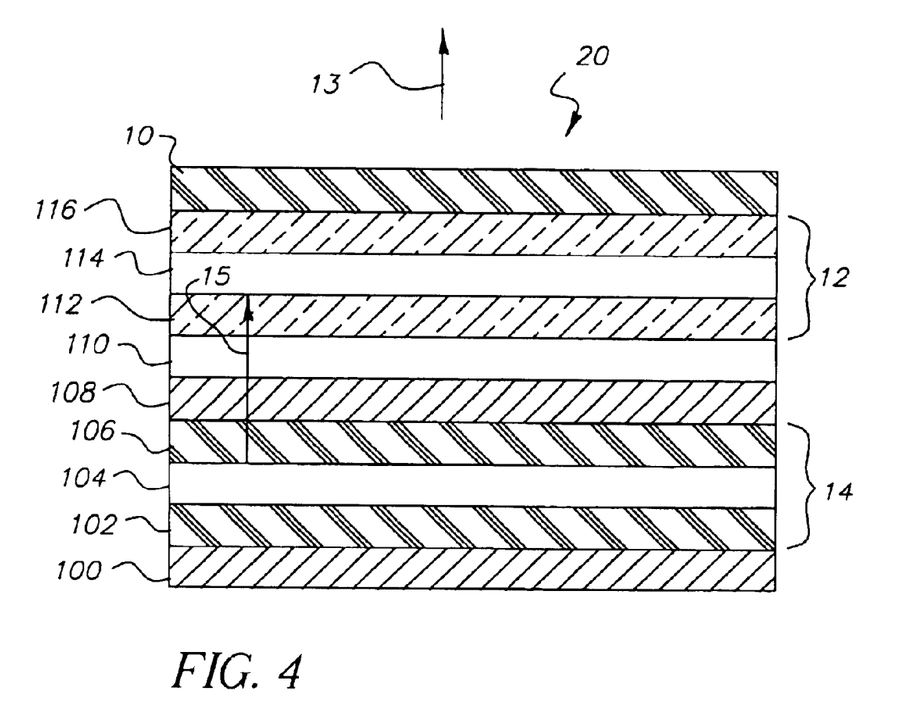
FIG. 4 is a schematic of an alternative embodiment of the OLED and the organic vertical cavity laser working in combination according to the present invention.

Alternatively, an electrode layer 100 can be formed on the planarization layer 110, which is typically electrically insulating and optically transparent to light, as shown in FIG. 4. An organic hole transport layer 102 is formed over the electrode layer 100, an organic light-emitting layer 104 is formed over the hole transport layer 102, and an organic electron transport layer 106 is formed over the light-emitting layer 104. As an example for these three layers, a useful structure includes a diamine layer, such as, 4,4'-bis[N-(1-naphthyl)-N-phenylamino]biphenyl (NPB) for the hole transport layer 102, undoped 9,10-Bis(2-naphthalenyl) anthracene (ADN) as the light-emitting layer 104, and Alq as the electron transport layer 106. These organic layers are typically prepared by high-vacuum thermal evaporation. Their preferred thicknesses are 40–250 nm for the NPB, 10–50 nm for the ADN, and 10–200 nm for the Alq.

Still referring to FIG. 4, a second electrode layer 108 (for example a cathode) is formed over the electron transport layer 106, and of a material selected to have a work function less than 4.0 eV. A suitable electrode layer 108 is indium tin oxide or MgAg, where the Mg—Ag volume ratio is 10:1. It can be formed by conventional thermal vapor deposition. A planarization layer 110 is formed over the second electrode layer 108 and the organic vertical cavity lasers 12 formed upon the planarization layer 110. Additional layers, as are known in the art, can be included in the OLED 14 structure, for example hole-injection and electron-injection layers. As is well understood in the art, a voltage V can be applied across the electrodes to provide the necessary electric field for causing the light-emitting layer 104 to produce the incoherent light 15, which is transmitted out of the OLED 14 device. The voltage V can be continuous or in the form of pulses. The controller 19 provides the voltage to drive the OLED 14 structure.

Referring to FIGS. 3 and 4, under typical bias conditions, electrons (negative-charge carriers) will be injected from the electrode layer 108 into the organic electron transport layer 106, and holes (positive charge carriers) will be injected from the electrode layer 100 into the organic hole transport layer 102. Electrons and holes are transported through the corresponding organic transport layers 106 and 102 and into the organic light-emitting layer 104. In the organic light-emitting layer 104 the electrons and holes mainly recombine near the junction between the hole transport layer 102 and the light-emitting layer 104. The resulting recombination results in light emission from the organic light-emitting layer 104. Of the light generated in the emitting layer, approximately 50% is directly emitted in the direction of the substrate 10 while the other 50% is emitted directly toward the electrode layer 108. The electrode layer 108 is transparent and allows the light to pass through the transparent planarization layer 110 to optically pump the organic vertical cavity laser 12.

In FIG. 3, the electrode layer 100 and/or the underlying substrate 10 can be made reflective so that the portion of the light emitted toward the electrode layer 100 can be reflected out of the device to pass through the planarization layer 110 as well. It is well known in the art that the positions of the anode and cathode, and the hole and electron injecting and/or transport layers can be reversed so that, for example, electrode layer 100 is a cathode and electrode layer 108 is an anode. In this case, a reflective cathode can be deposited upon the substrate 10 while the anode is transparent.

Referring to FIGS. 3 and 4, after exiting the OLED 14, the incoherent light 15 enters the organic vertical cavity lasers 12 through the bottom DBR mirror 112. As a result of the bottom DBR mirror design, the majority of that light passes into the active layer 114. By construction, the active layer host absorbs some fraction of the incoherent light 15. Of the fraction of light which did not get absorbed (for cases where the active layer's absorption length is too small), the remaining fraction of incoherent light 15 enters the top DBR mirror 116, whereby a large fraction of the light is back-reflected into the active layer 114 for a second pass. During the second pass, an additional fraction of the incoherent light 15 is absorbed by the active layer host. Via the Forster energy transfer mechanism, the light energy absorbed by the host is non-radiatively transferred to the dopant molecules. It is preferred that the dopant molecule has a high quantum efficiency for emission since that results in the majority of the non-radiatively transferred energy being re-emitted as longer wavelength light For example, with ADN as the OLED 14 light emitter material, Alq as the active layer host, and DCJTB as the active layer dopant, the emitted OLED 14 light is blue, Alq mainly absorbs in the blue, while DCJTB emits in the red.

The organic vertical cavity laser 12 is designed to be a high-Q cavity for red light, especially for wavelengths where the top and bottom DBR mirrors have their highest reflectivities. Those skilled in the art are familiar with the concept that lasing occurs at a particular wavelength which has the highest net gain. At that wavelength, the laser light beam 13 reflects many times between the top and bottom DBR mirrors prior to being emitted mainly through the top DBR mirror 116 (since by design the mirror loss of the bottom DBR mirror is much lower than that of the top DBR mirror).

In the embodiment shown in FIG. 3, the organic vertical cavity laser 12 and the electrically-driven OLED 14 are combined in an integrated device formed on the substrate 10 with the electrically driven OLED 14 located on the substrate 10 and the organic vertical cavity lasers 12 above the OLED 14 and separated from it by the planarization layer 110. Consequently, the bottom DBR mirror 112 is composed of alternating high and low refractive index dielectric layers, such that, at the wavelength for the laser light beam 13, its reflectivity is greater than 99.9% and it transmits greater than 90% of the incoherent light 15. Correspondingly, the top DBR mirror 116 is composed of alternating high and low refractive index dielectric layers, such that, at the wavelength for the laser light beam 13 its reflectivity is greater than 98% and it reflects greater than 90% of the incoherent light 15. Note that the design of such a top DBR mirror 116 is different for the embodiments shown in FIG. 3 and FIG. 4, as a consequence of the fact that the laser light beam 13 is launched into air in the former and into the substrate 10 in the latter. Similarly, the bottom DBR mirror 112 would also be somewhat different for the two embodiments.

Referring to FIG. 4, in an alternative embodiment of the present invention, the substrate 10 is transparent and is located adjacent to the organic vertical cavity laser 12, and preferably the organic vertical cavity laser 12 is formed upon the substrate 10, so that light is emitted through the substrate 10.

Figure 5:
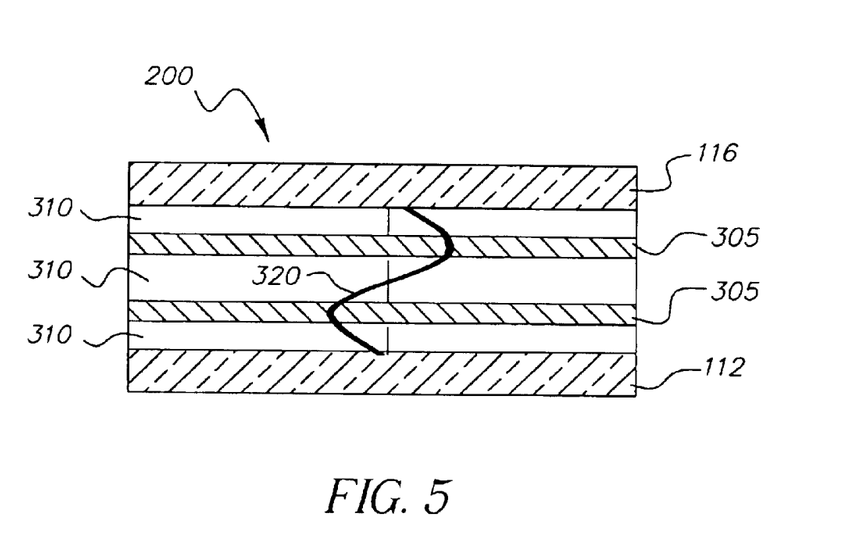
FIG. 5 is a schematic of an exemplary organic vertical cavity laser used in the present invention.

The efficiency of the laser can be improved using an alternate active layer 114 design for the vertical cavity organic laser structure. Referring to FIG. 5, periodic gain layers 305 are aligned with the antinodes of the device's standing wave electromagnetic field, where the laser's standing wave electromagnetic field pattern 320 in the laser element 200 is schematically shown. Since stimulated emission is highest at the antinodes and negligible at the nodes of the electromagnetic field, it is inherently advantageous to form the periodic gain layers 305 as shown in FIG. 5, separated by organic spacer layers 310. The organic spacer layers 310 do not undergo stimulated or spontaneous emission and largely do not absorb either the laser light beam 13 or the incoherent light 15 wavelengths. An example of a material suitable for forming an organic spacer layer 310 is the organic material 1,1-Bis-(4-bis(4-methyl-phenyl)-amino-phenyl)-cyclohexane (TAPC).

TAPC works well as the spacer layer 310 since it largely does not absorb either the laser output or the pump-beam energy and, in addition, its refractive index is slightly lower than that of most organic host materials. This refractive index difference is useful since it helps in maximizing the overlap between the electromagnetic field antinodes and the periodic gain layers 305. As will be discussed below with reference to the present invention, employing periodic gain region(s) instead of a bulk gain region results in higher power conversion efficiencies and a significant reduction of the unwanted spontaneous emission. The placement of the gain region(s) is determined by using the standard matrix method of optics (Scott W. Corzine et al. IEEE Journal of Quantum Electronics, Vol. 25, No. 6, June 1989, pages 1415–1524). To get good results, the thicknesses of the periodic gain layer(s) 305 need to be at or below 50 nm in order to avoid unwanted spontaneous emission.

Figure 6:
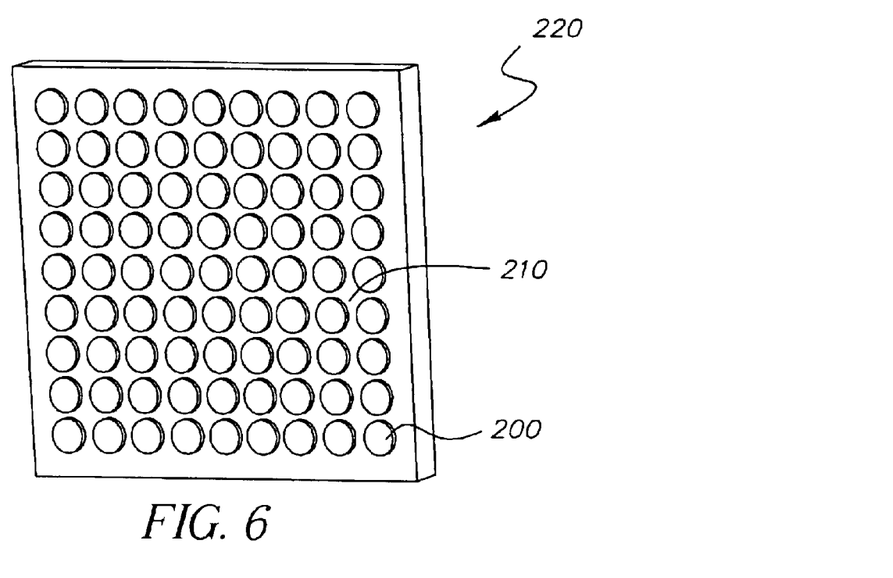
FIG. 6 is a schematic example of the laser pixels formed by the organic vertical cavity laser in FIG. 5.

A laser pixel 11 can be increased in area while maintaining a degree of spatial coherence by utilizing a phase-locked organic laser array 220 as depicted in FIG. 6. To form a two-dimensional phase-locked laser array 220, laser elements 200 separated by inter-element spacing 210 need to be defined on the surface of the organic vertical cavity lasers 12. To obtain phase locking, intensity and phase information must be exchanged amongst the laser elements 200. This is best obtained by weakly confining the laser emissions to the lasing regions by either small amounts of built-in index or gain guiding, e.g. by modulating the reflectance of one of the mirrors.

In the embodiment shown in FIG. 6, the reflectance modulation is affected by patterning and forming an etched region in the bottom dielectric stack, using standard photolithographic and etching techniques, thus forming a two-dimensional array of laser elements 200 in the form of circular pillars on the surface of the bottom dielectric stack, shown herein isometrically. The remainder of the organic laser micro-cavity structure is deposited upon the patterned bottom dielectric stack as described above. In this embodiment the shape of the laser elements 200 is circular; however, other shapes are possible, such as rectangular. The inter-element spacing 210 is in the range of 0.25 to 4 µm.

Phase-locked array operation will also occur for larger inter-element spacing 210; however, larger spacings lead to inefficient usage of the optical-pumping energy. The etch depth is preferred to be from 200 to 1000 nm deep. By etching just beyond an odd number of layers into the bottom dielectric stack, it is possible to effect a significant shift of the longitudinal mode wavelength in the etched region away from the peak of the gain media. Hence, lasing action is prevented and spontaneous emission is significantly reduced in the area between the laser elements 200. The end result of the formation of etched region is that the laser emission is weakly confined to the laser elements 200, no lasing originates from the area between the regions, and coherent phase-locked laser light is emitted by the laser array 220.

Each laser light emitter 20 of an individually addressable laser pixel 11 emits light of a specific color, determined by the frequencies emitted by the incoherent OLED 14 and the construction of the organic vertical cavity lasers 12. The laser light emitters 20 are typically very small, on the order of a few square microns. A white-light laser 8 (shown in FIG. 7) is obtained by spatially alternating laser light emitters 20 emitting light of different colors over the substrate 10 corresponding to each individually addressable laser pixel 11 whose light, when combined, forms a substantially white light An individually addressable laser pixel 11 has a size of at least ten or more square microns and includes a plurality of laser light emitters 20. These laser light emitters 20 may be arranged in a variety of ways across the extent of the individually addressable laser pixel 11.

Figure 7:
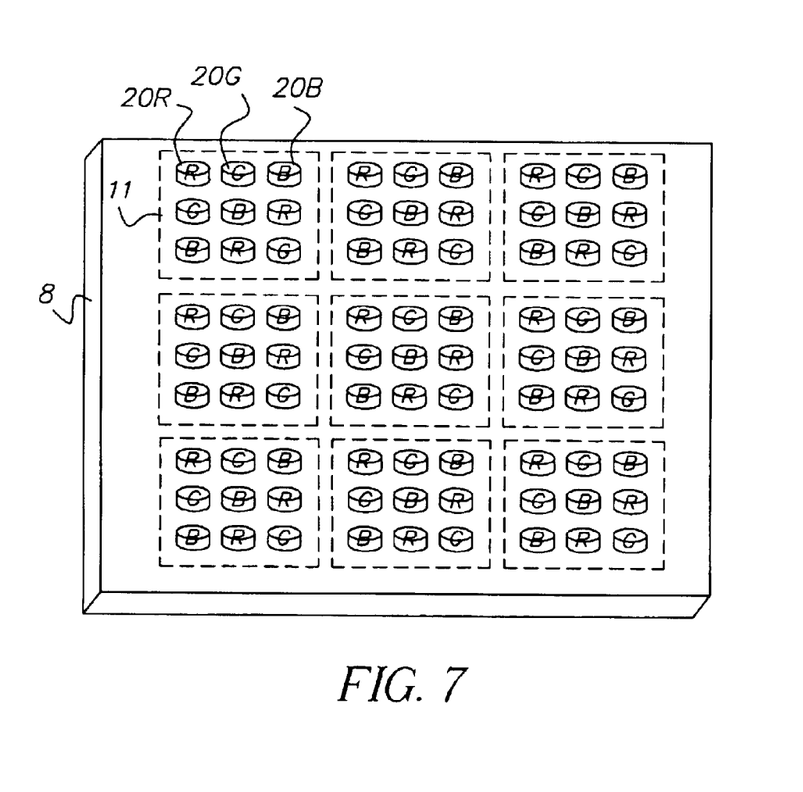
FIG. 7 is an exemplary schematic of the white-light laser according to the present invention.

Referring to FIG. 7, an individually addressable laser pixel 11 includes a plurality of laser light emitters 20 emitting light of different colors, for example red 20R, green 20G, and blue 20B. The OLED 14 light emitter shown in FIG. 1 and associated with the laser light emitters 20 may have correspondingly different light outputs to optimize the laser light output of each of the laser light emitters 20, and the different organic vertical cavity lasers 12 may have correspondingly different structures to accommodate the color of light output. The color of the overall light output can be controlled by including specific ratios of the different colored lasing emitters 20R, 20G, and 20B (shown in equal numbers in FIG. 7). The specific ratio of each of the element types will depend on their color and the desired white point of the light.

Figure 8:
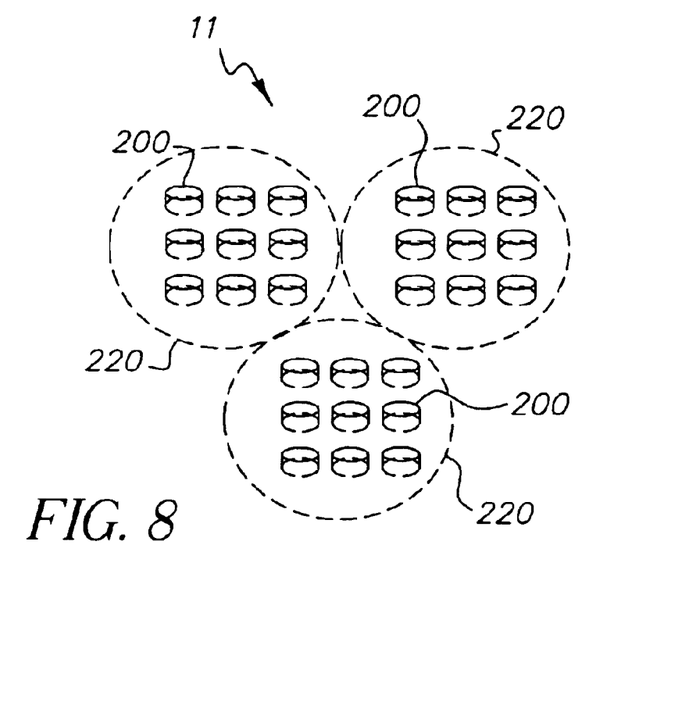
FIG. 8 is a schematic of the individually addressable laser pixel used in the present invention.

The separate laser elements within individually addressable laser pixels 11 may be grouped by color of light emission to promote mode-locking between members of the group. Referring to FIG. 8, an individually addressable light emitting laser pixel 11 includes three laser arrays 220 of laser elements 200 for emitting light of different colors. Each laser array 220 includes one or more laser elements 200 wherein all of the laser elements 200 within a laser array 220 emit light of the same color. The laser elements 200 within the group may be spatially near each other so as to promote mode-locking and coherence among the elements of the group. On the contrary, the spacing between laser arrays 220 may be larger; having the laser arrays 220 spatially further apart discourages mode-locking. In a another embodiment, the shape of the laser pixels 11 is circular; however, other pixel shapes are possible, such as rectangular, for example. The spacing between laser elements 200 is in the range of 0.25 to 4 μm. Phase-locked array operation also occurs for larger inter-pixel spacing; however, it leads to inefficient usage of the optical-pumping energy. It is possible to effect a significant shift of the longitudinal mode wavelength in the space between laser elements 200 away from the peak of the gain media. Hence, lasing action is prevented and spontaneous emission is significantly reduced in this region. The end result is that the laser emission is weakly confined to the laser arrays 220, no lasing originates from the space between laser elements 200, and coherent phase-locked laser light is emitted by the phase-locked laser arrays 220.

As noted above, the laser arrays 220 may have different numbers of elements to provide a specific intensity of light emission from each group. The overall color of light emitted from the laser pixel 11 can be adjusted by adjusting the intensity of light emission from each group, thereby, for example, adjusting the white point of a white emitting laser pixel 11. Alternatively, a white emitting pixel 11 may include a mixed group of differently colored laser elements 200 that are not mode locked, but that are arranged in a manner that promotes the mixing of the colors from the laser elements 200.

Different OLED materials can be used in association with each group as desired to assist the emission of differently colored light from each group within a single, individually addressed light emitting laser pixel 11. Alternatively, a broadband, white OLED material may be used for all OLEDs 14 within an individually addressable laser pixel 11. It is required that the OLED 14 have a light output in the spectral range that overlaps the spectral range for absorption of incoherent light 15 by the host material in the active layer 114. For the embodiment described previously, the aluminum tris(8-hydroxyquinoline) (Alq) layer absorbs light in the blue spectral region, roughly 400–450 nm; other host materials would absorb light in different spectral regions. Light not absorbed in active layer 114 would be useful to assist in the emission of differently colored light.

In operation, power is applied to an individually addressable laser pixel 11 through circuitry on the substrate 10. Each of the one or more individually controlled laser pixels uses a single contiguous cathode and a single contiguous anode to provide power to the OLED (shown as electrode layer 100 and electrode layer 108 in FIGS. 3 and 4). The power then causes the one or more OLEDs 14 corresponding to the individually addressable laser pixels 11 to emit light that pumps the associated laser emitters 20R, 20G, and 20B. The laser emitters 20 together emit white laser light orthogonal to the substrate 10. Note that the OLED 14 patterning requirements may be considerably simpler than the patterning requirements for the laser elements 200. In cases where the white point is fixed and no adjustment of the white point is required, one OLED 14 will simultaneously excite the laser elements 200 of a laser pixel 11. In cases where adjustment of the white point is required, there will be a one-to-one correspondence between the number and position of the OLEDs 14 and the laser elements 200. In this way, the white point can be changed by adjusting the OLED 14 light level exciting the individual red, green, and blue elements.

A variety of differently colored laser elements 200 may be associated with an individually addressable laser pixel 11. For example, four elements may be used to increase the gamut of any application utilizing the white light source. Alternatively, two elements, for example blue and yellow or red and cyan or green and magenta, may be used.

Figure 9:
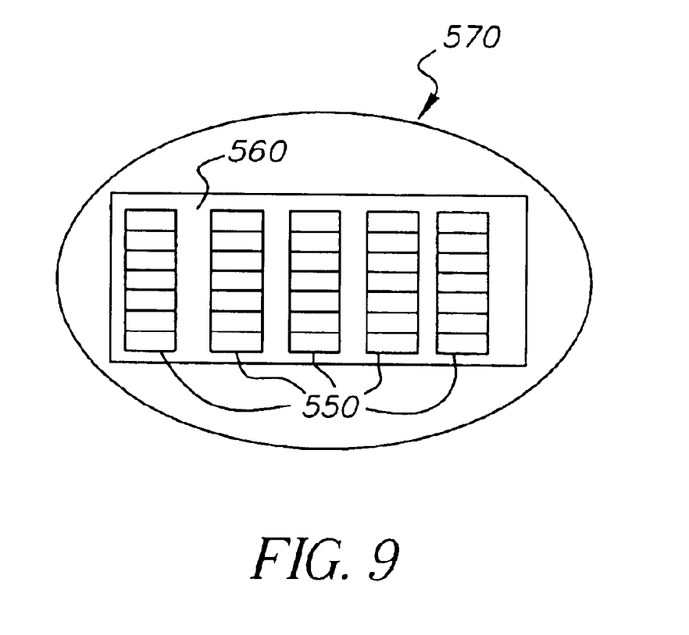
FIG. 9 is an end view of a polarized white-light laser according to the present invention.

In FIG. 9 an end-view of a polarized white-light laser 570 is displayed. A polarized white-light laser is a device that produces substantially white laser light with a single orientation for the emitted light polarization direction. Polarization direction refers to the direction of the electric field of the emitted light. Referring to FIG. 9, polarizing organic vertical cavity laser structures 560 are two-dimensional arrays of polarized organic vertical cavity devices 550 that can produce polarized emitted laser light. It is well known in the art of vertical cavity lasers that VCSELs offer the opportunity for polarization mode control. A number of methods for laser polarization control exist. In "Vertical-Cavity Surface-Emitting Lasers" by Carl W. Wilmsen, et al., Cambridge University Press, 1999, for example, control of polarization mode by the use of asymmetric vertical cavity laser array elements is described. One mechanism for producing a laser output with stable single polarization is to reduce the size of the vertical cavity laser device in one dimension. For example, a rectangular vertical cavity laser device with dimensions 6×3.5 μm, exhibit increased diffraction loss of fundamental-mode emission by the size reduction from a fully symmetric device geometry (6×6 μm). This leads to pinning of the polarization emission direction. Polarized laser light (not shown) is emitted normal to the surface of the polarized organic vertical cavity devices 550. The individual polarized organic vertical cavity devices 550 are fabricated so as to produce different color emitted polarized light that results in a polarized white-light output from the polarized white-light laser 570.

Figure 10:
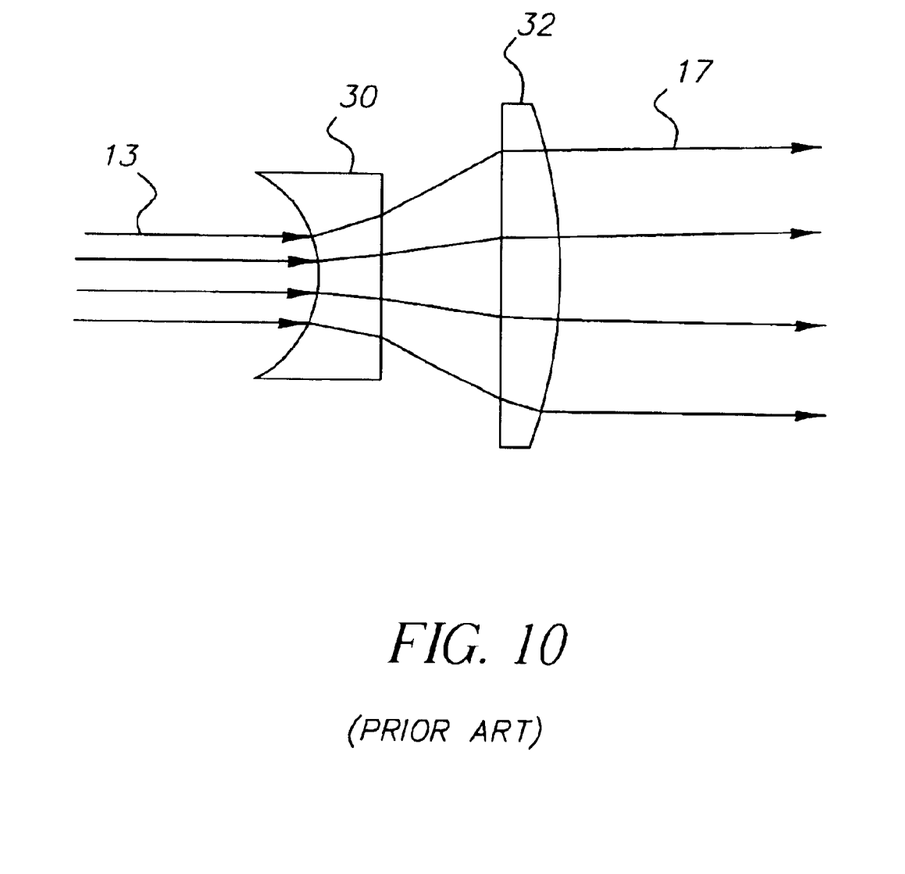
FIG. 10 is a prior art beam expander.

A further embodiment of the present invention may employ an optical system, for example a spreading lens system, to spread the beam of laser light across a wider area and enlarge the image. Alternatively, an optical system can be employed to reduce the size of the beam. Referring to FIG. 10, a Galilean Beam Expander known in the prior art has at least two optical elements 30 and 32 that convert an incident beam of collimated laser light beam 13 and enlarge it into a broader beam 17. The magnification of the optical system is the ratio of the focal lengths of the two elements 30 and 32 and the distance between the elements 30 and 32 is the sum of the focal lengths.

The invention has been described in detail with particular reference to certain perferred embodiments thereof, but it will be understood that variations and modification can be effected within the spirit and scope of the invention.

PARTS LIST 8. white-light laser
9. white-light laser beam
10. substrate
11. laser pixel
12. organic vertical cavity lasers
12R. red organic vertical cavity lasers
12B. blue organic vertical cavity lasers
12G. green organic vertical cavity lasers
13. laser light beam
14. OLED
14R. red OLED
14B. blue OLED
14G. green OLED
15. laser light
16. circuit
17. beam
18. connections
19. controller
20. laser light emitter
20R. red emitter
20B. blue emitter
20G green emitter
21. bus input
30. element
32. element
100. electrode layer
102. transport layer
104. light-emitting layer
106. transport layer
108 electrode layer
110 planarization layer PARTS LIST—continued 112 mirror
114 active layer
116 mirror
120 OLED light
200 laser element
210 inter-element spacing
220 laser array
305 periodic gain layer
310 spacer layer
320 field pattern
550 polarized organic vertical cavity devices
560 organic vertical cavity laser structures
570 polarized white-light laser

What is claimed is:

1. A white-light laser integrated structure comprising:
   a) a substrate; and
   b) one or more individually addressable laser light pixels formed on the substrate for emitting a white beam of laser light perpendicular to the substrate, each of the one or more individually addressable laser light pixels include one or more organic light emitting diodes (OLEDs) and a plurality of organic vertical cavity lasers that are arranged to be optically pumped by the one or more OLEDs, wherein the plurality of organic vertical cavity lasers emit differently colored light and the one or more individually addressable laser light emitting pixels emit substantially white light when the differently colored light is combined.

2. The white-light laser claimed in claim 1, wherein the plurality of organic vertical cavity lasers emits two different colors of light.

3. The white-light laser claimed in claim 2, wherein the two different colors of light are yellow and blue.

4. The white-light laser claimed in claim 1, wherein the plurality of organic vertical cavity lasers emits three different colors of light.

5. The white-light laser claimed in claim 4, wherein the three different colors of light are red, green, and blue.

6. The white-light laser claimed in claim 1, wherein the plurality of organic vertical cavity lasers emits four different colors of light.

7. The white-light laser claimed in claim 6, wherein the four different colors of light are red, green, yellow, and blue.

8. The white-light laser claimed in claim 1, wherein the organic vertical cavity lasers are formed on the substrate and the one or more OLED is on the plurality of organic vertical cavity lasers causing light to be emitted through the substrate.

9. The white-light laser claimed in claim 1, wherein the one or more OLEDs are formed on the substrate and the plurality of organic vertical cavity lasers is on the one or more OLED.

10. The white-light laser claimed in claim 1, wherein one of the individually addressable laser light pixels emits white light and one or more additional individually addressable laser light pixels emit colored light.

11. The white-light laser claimed in claim 1, wherein different OLED materials are used to emit light of different frequencies, each associated with a corresponding organic vertical cavity laser.

12. The white-light laser claimed in claim 1, wherein the one or more OLED material is a white-light emitting OLED material used to emit light having a broad spectrum and optically pumps the plurality of organic vertical cavity lasers.

13. The white-light laser claimed in claim 1, wherein the plurality of organic vertical cavity lasers have an asymmetric shape and produce polarized light.

14. The white-light laser claimed in claim 1, wherein the plurality of organic vertical cavity lasers are grouped into groups wherein each group emits same-colored light.

15. The white-light laser claimed in claim 14, wherein the plurality of organic vertical cavity lasers within a group are mode-locked.

16. The white-light laser claimed in claim 15, wherein the mode-locked organic vertical cavity lasers are spatially separated by a common spatial separation within the group, and wherein the groups themselves are separated by a different spatial separation.

17. The white-light laser claimed in claim 14, wherein the plurality of organic vertical cavity laser within a group are not mode-locked.

18. The white-light laser claimed in claim 1, wherein each of the one or more individually addressable laser light pixels uses a single contiguous cathode and a single contiguous anode to provide power to the one or more OLED.

19. A polarized white-light laser, comprising:
   a) a substrate; and
   b) one or more individually addressable laser light pixels formed on the substrate for emitting a white beam of laser light perpendicular to the substrate, each of the one or more individually addressable laser light pixels include one or more organic light emitting diodes (OLEDs) and a plurality of organic vertical cavity lasers, having an asymmetric shape and producing polarized light, that are arranged to be optically pumped by the one or more OLEDs, wherein the plurality of organic vertical cavity lasers emit differently colored light and the one or more individually addressable laser light pixels emit substantially white light when the differently colored light is combined.

20. The white-light laser claimed in claim 19, wherein the plurality of organic vertical cavity lasers emits three different colors of light.

21. The white-light laser claimed in claim 20, wherein the three different colors of light are red, green, and blue.

22. The white-light laser claimed in claim 19, wherein the plurality of organic vertical cavity lasers are formed on the substrate and the one or more OLED is on the plurality of organic vertical cavity laser causing light to be emitted through the substrate.

23. The white-light laser claimed in claim 19, wherein each of the one or more individually addressable laser light pixels uses a single contiguous cathode and a single contiguous anode to provide power to the one or more OLED.

24. A system for producing an array of image elements forming a collimated beam of patterned white-light, comprising:
   a) a controller and connections;
   b) a plurality of individually addressable laser light pixels formed on a common substrate responsive to the controller for producing the array of image elements; and
   c) each of the plurality of individually addressable laser light pixels include one or more organic light emitting diodes (OLEDs) and a plurality of organic vertical cavity lasers that are arranged to be optically pumped by the one or more OLEDs, wherein the plurality of organic vertical cavity lasers emit differently colored light perpendicular to the substrate and the plurality of individually addressable laser light pixels emit substantially white light when the differently colored light is combined.

25. The system claimed in claim 24, wherein the plurality of organic vertical cavity lasers have an asymmetric shape and produce polarized light.

26. The system claimed in claim 24, wherein the plurality of organic vertical cavity lasers emits three different colors of light.

27. The system claimed in claim 26, wherein the three different colors of light are red, green, and blue.

28. The system claimed in claim 24, wherein the plurality of organic vertical cavity lasers are formed on the substrate and the one or more OLED is on the plurality of organic vertical cavity lasers causing light to be emitted through the substrate.

29. The system claimed in claim 24, wherein each of the one or more individually addressable laser light pixels uses a single contiguous cathode and a single contiguous anode to provide power to the one or more OLED.

30. The system claimed in claim 24, wherein one of the individually addressable laser light pixels emit white-light and one or more additional individually addressable laser light pixels emit colored light.

31. A method for creating a white-light laser comprising the steps of:
   a) providing a substrate; and
   b) forming one or more individually addressable laser light pixels on the substrate, wherein each of the one or more individually addressable laser light pixels include one or more organic light emitting diodes (OLEDs) and a plurality of spatially distributed organic vertical cavity lasers for emitting a white beam of laser light perpendicular to the substrate from a plurality of different colored light emitted from the plurality of spatially distributed organic vertical cavity lasers.

32. The method claimed in claim 31, wherein the plurality of spatially distributed organic vertical cavity lasers have an asymmetric shape and produce polarized light.

33. The method claimed in claim 31, wherein the plurality of spatially distributed organic vertical cavity lasers are grouped into groups wherein each group emits same-colored light.

34. The method claimed in claim 33, wherein the plurality of spatially distributed organic vertical cavity lasers within a group are mode-locked.

35. The method claimed in claim 34, wherein the mode-locked plurality of spatially distributed organic vertical cavity lasers are spatially separated by a common spatial separation within the group, and wherein the groups themselves are separated by a different spatial separation.

36. The method claimed in claim 31, wherein each of the one or more individually addressable laser light pixels uses a single contiguous cathode and a single contiguous anode to provide power to the one or more OLED.

37. The method claimed in claim 31, wherein the plurality of spatially distributed organic vertical cavity lasers emits three different colors of light.

38. The method claimed in claim 37, wherein the three different colors of light are red, green, and blue.

* * * * *